United States Patent
Righter

(10) Patent No.: US 7,038,280 B2
(45) Date of Patent: May 2, 2006

(54) INTEGRATED CIRCUIT BOND PAD STRUCTURES AND METHODS OF MAKING

(75) Inventor: Alan W. Righter, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/694,675

(22) Filed: Oct. 28, 2003

(65) Prior Publication Data
US 2005/0087807 A1 Apr. 28, 2005

(51) Int. Cl.
H01L 23/62 (2006.01)
H01L 23/58 (2006.01)
H01L 23/48 (2006.01)
H01L 23/52 (2006.01)
H01L 29/40 (2006.01)

(52) U.S. Cl. ............... 257/355; 257/758; 257/494; 257/786

(58) Field of Classification Search ............... 257/173, 257/758–762, 355–360, 494, 786
See application file for complete search history.

(56) References Cited

U.S. PATENT DOCUMENTS

| | | | |
|---|---|---|---|
| 5,514,892 A | 5/1996 | Countryman et al. | |
| 5,517,048 A | 5/1996 | Kosaka | |
| 5,751,065 A | 5/1998 | Chittipeddi et al. | |
| 5,901,022 A | 5/1999 | Ker | |
| 6,147,538 A | 11/2000 | Andresen et al. | |
| 6,157,065 A | 12/2000 | Huang et al. | |
| 6,207,547 B1 | 3/2001 | Chittipeddi et al. | |
| 6,384,486 B1 | 5/2002 | Zuniga et al. | |
| 6,495,918 B1 * | 12/2002 | Brintzinger | 257/758 |
| 6,731,007 B1 * | 5/2004 | Saito et al. | 257/762 |
| 6,788,507 B1 * | 9/2004 | Chen et al. | 257/494 |
| 6,858,885 B1 * | 2/2005 | Ebara | 257/173 |
| 2001/0045670 A1 * | 11/2001 | Nojiri | 257/786 |
| 2003/0042499 A1 * | 3/2003 | Reiner | 257/173 |
| 2003/0174452 A1 | 9/2003 | Chen et al. | |
| 2005/0023692 A1 * | 2/2005 | Matsunaga et al. | 257/758 |

FOREIGN PATENT DOCUMENTS

EP 0 516 146 A1 12/1992

OTHER PUBLICATIONS

Anderson et al., "ESD Protection under Wire Bonding Pads", EOS/ESD Symposium 99-88, pp. 2A.4.1 to 2A.4.7.
Search Report from corresponding International Application No. PCT/US2004/034647.

* cited by examiner

*Primary Examiner*—Cuong Nguyen
(74) *Attorney, Agent, or Firm*—Wolf, Greenfield & Sacks, P.C.

(57) ABSTRACT

A bond pad structure for an integrated circuit includes first and second active devices formed in a substrate, first and second buses above the first and second active devices, respectively, a bond pad above the first and second buses, first interconnections between the first and second active devices and the bond pad, and second interconnections between the first and second active devices and the first and second buses, respectively. The first active device may be at least one PMOS transistor, and the second active device may be at least one NMOS transistor. A guard band region may be formed in the substrate.

37 Claims, 10 Drawing Sheets

INTEGRATED CIRCUIT BOND PAD STRUCTURES AND METHODS OF MAKING

FIELD OF THE INVENTION

This invention relates to integrated circuit structures and, more particularly, to bond pad structures having circuitry associated therewith, and to methods of making the bond pad structures.

BACKGROUND OF THE INVENTION

One of the components of an integrated circuit chip is an array of bond pads for electrically connecting the chip to other components of the system in which it is utilized. The bond pad array typically includes multiple bond pads located around the periphery of the integrated circuit chip. Each bond pad is a conductive area used for bonding a connecting wire, the other end of which is connected to a pin of the integrated circuit package. Interface circuitry, such as electrostatic discharge (ESD) protection circuitry and level shifting circuitry, may be associated with the bond pad.

In a common approach, bond pads and associated circuitry are positioned adjacent to each other on a chip. A top schematic view of a prior art bond pad structure is shown in FIG. 1. A bond pad 10 is located at the periphery of an integrated circuit chip 12. Bond pad 10 may be a conductive metal having a sufficient area for bonding of a connecting wire. An ESD protection circuit 20 is located adjacent to and electrically connected to bond pad 10. ESD protection circuit 20 may include PMOS ESD/buffer transistors 22 located under a power supply bus 24 and NMOS ESD/buffer transistors 26 located under a power return bus 28. An isolation/control logic block 30, located between PMOS transistors 22 and NMOS transistors 26, includes control logic and provides isolation between PMOS transistors 22 and NMOS transistors 26. As is apparent from FIG. 1, the prior art bond pad 10 and ESD protection circuit 20 occupy significant chip area. The required area is multiplied by the number of I/O pins on the chip.

Integrated circuits have undergone dramatic increases in function and performance, and dramatic decreases in feature sizes. These trends have impacted the requirements for bond pad structures. As device features have become smaller, the ESD pulse that an integrated circuit is required to withstand has remained the same. Although the density of other circuits has increased, the chip area required to dissipate the ESD pulse has remained nearly constant. In addition, the number of bond pads on a chip has increased with increasing circuit complexity. These trends have resulted in bond pads and ESD protection circuitry occupying a significant proportion of the total chip area on state of the art integrated circuits. It is not uncommon for bond pads and related circuitry to occupy 10–15% of the die area in state of the art integrated circuits.

Various designs for ESD protection circuits and bond pads have been disclosed in the prior art. See, for example, U.S. Pat. No. 5,514,892, issued May 7, 1996 to Countryman et al.; U.S. Pat. No. 5,517,048, issued May 14, 1996 to Kosaka; U.S. Pat. No. 5,751,065, issued May 12, 1998 to Chittipeddi et al.; U.S. Pat. No. 5,901,022, issued May 4, 1999 to Ker; U.S. Pat. No. 6,157,065, issued Dec. 5, 2000 to Huang et al.; U.S. Pat. No. 6,207,547, issued Mar. 27, 2001 to Chittipeddi et al; U.S. Pat. No. 6,384,486, issued May 7, 2002 to Zuniga et al; and W. R. Anderson et al. "ESD Protection Under Wire Bonding Pads", EOS/ESD Symposium 99–89, pp. 2A.4.1–2A.4.7.

It has been proposed in the prior art to fabricate ESD protection circuitry underneath bond pads. One of the difficulties in this approach is that the bond pad is subjected to thermal and mechanical stresses during the bonding process. Such stresses may damage or destroy sensitive layers and circuitry located under the bond pad. In addition, prior art methods of fabricating MOS transistors under bond pads have not addressed the latchup reliability issue. This issue is present when large active devices are placed under bond pads and in close proximity to circuitry of neighboring bond pads and/or neighboring circuitry outside the bond pad. Furthermore, the area underneath bond pads is very limited due to the need to minimize bond pad area.

None of the prior art bond pad structures has been entirely satisfactory with respect to die area and reliability. Accordingly, there is a need for new and improved bond pad structures and methods of making bond pad structures.

SUMMARY OF THE INVENTION

According to a first aspect of the invention, a bond pad structure for an integrated circuit is provided. The bond pad structure comprises first and second active devices formed in a substrate, first and second buses above the first and second active devices, respectively, a bond pad above the first and second buses, first interconnections between the first and second active devices and the bond pad, and second interconnections between the first and second active devices and the first and second buses, respectively.

The first active device may comprise at least one PMOS transistor, and the second active device may comprise at least one NMOS transistor. In some embodiments, the first active device comprises a plurality of PMOS transistors and the second active device comprises a plurality of NMOS transistors. The first bus may comprise a power supply bus, and the second bus may comprise a power return bus. The first and second buses may connect to multiple bond pad structures on an integrated circuit chip.

The bond pad structure may further include a guard band region formed in the substrate. The guard band region may include an N+ guard band for isolation of PMOS transistors and a P+ guard band for isolation of NMOS transistors. The N+ guard band may surround the PMOS transistors and may be connected to the power supply bus. The P+ guard band may surround the NMOS transistors and may be connected to the power return bus.

The PMOS and NMOS transistors may each include source, drain and gate fingers which are elongated in a direction of current flow in the first and second buses and which are narrow perpendicular to the direction of current flow. The PMOS and NMOS transistors may be configured as electrostatic discharge protection devices.

Conductive islands may be formed in the first and second buses for connection of the bond pad to the PMOS and NMOS transistors. The conductive islands may be elongated in the direction of current flow in the first and second buses and may be narrow perpendicular to the direction of current flow. Each of the first interconnections may comprise a plurality of individual contacts between the bond pad and the conductive islands and between the conductive island and the active devices. The contacts between different levels may be laterally offset.

According to a second aspect of the invention, a bond pad structure for an integrated circuit is provided. The bond pad structure comprises an active device formed in a substrate, a power bus above the active device, a bond pad above the power bus, a first interconnection between the active device and the bond pad, and a second interconnection between the active device and the power bus.

The active device may comprise one or more electrostatic discharge protection devices. In some embodiments, the active device comprises at least one MOS transistor. In other embodiments, the active device comprises at least one silicon controlled rectifier.

According to a third aspect of the invention, a method is provided for fabricating a bond pad structure for an integrated circuit. The method comprises forming first and second active devices in a substrate, forming first and second buses above the first and second active devices, respectively, forming a bond pad above the first and second buses, interconnecting the first and second active devices and the bond pad, and interconnecting the first and second active devices and the first and second buses, respectively.

According to a fourth aspect of the invention, a method is provided for fabricating a bond pad structure for an integrated circuit. The method comprises forming an active device in a substrate, forming a bus above the active device, forming a bond pad above the bus, interconnecting a first terminal of the active device and the bond pad, and interconnecting a second terminal of the active device and the bus.

According to a fifth aspect of the invention, a bond pad structure is provided for an integrated circuit. The bond pad structure comprises first and second circuit areas formed in a substrate, a guard band region formed in the substrate, first and second buses above the first and second circuit areas, respectively, a bond pad above the first and second buses, at least one first interconnection between circuitry in one or both of the first and second circuit areas and the bond pad, and at least one second interconnection between circuitry in one or both of the first and second circuit areas and the first and second buses.

In some embodiments, the bond pad structure further comprises at least one PMOS transistor in the first circuit area and at least one NMOS transistor in the second circuit area. In other embodiments, the bond pad structure further comprises at least one silicon controlled rectifier in the first circuit area, and the second circuit area serves as an isolation area. A guard band region may surround the silicon controlled rectifier. The silicon controlled rectifier may be utilized to protect either the input or the output of a circuit.

BRIEF DESCRIPTION OF THE DRAWINGS

For a better understanding of the present invention, reference is made to the accompanying drawings, which are incorporated herein by reference and in which.

DETAILED DESCRIPTION

Figure 2:
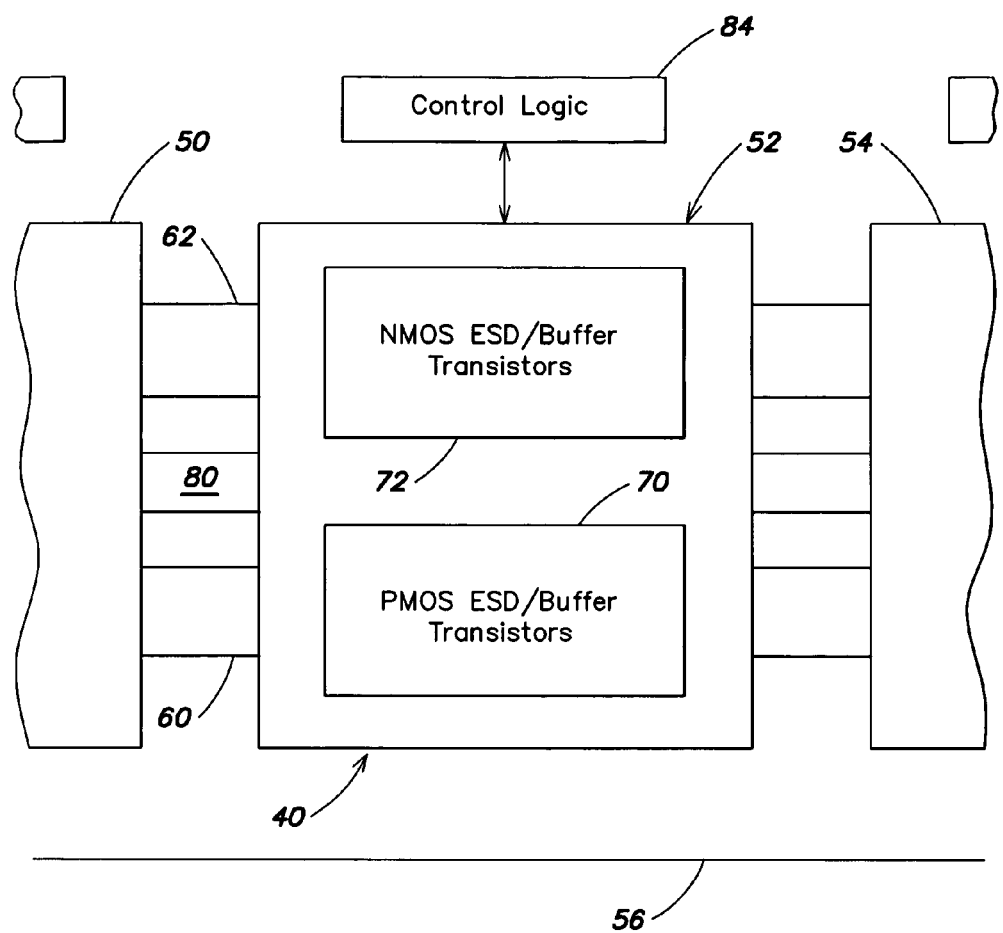
FIG. 2 is a top schematic view of a bond pad structure in accordance with a first embodiment of the invention.

A top schematic view of a bond pad structure 40 in accordance with a first embodiment of the invention is shown in FIG. 2. The bond pad structure 40 is one of an array of bond pad structures on an integrated circuit chip 56. Each of the bond pad structures includes a bond pad and associated circuitry. Bond pads 50, 52 and 54 are positioned side-by-side at the periphery of integrated circuit chip 56. Integrated circuit chip 56 may include any desired number of bond pads. The bond pads are typically located at or near the periphery of integrated circuit chip 56, but may have other locations in particular applications. Each of bond pads 50, 52, and 54 is associated with a bond pad structure. In FIG. 2, bond pad structure 40 is shown by way of example. Other bond pad structures in the bond pad array may have the same or different configurations. In one embodiment, multiple bond pad structures in the bond pad array have the same configuration. As used herein, the phrase "bond pad structure" includes the bond pad itself and circuitry and interconnections associated with the bond pad.

The bond pad structure 40 includes bond pad 52, a power supply bus 60 and a power return bus 62. Power supply bus 60 and power return bus 62 pass under each of the bond pads 50, 52 and 54. The bond pad structure 40 further includes a first circuit area 70 under power supply bus 60 and a second circuit area 72 under power return bus 62. One or both of circuit areas 70 and 72 may include circuitry, such as ESD protection devices or circuitry which can function as I/O circuitry, as ESD protection circuitry, or both. In the embodiment of FIG. 2, first circuit area 70 includes PMOS ESD/buffer transistors, and second circuit area 72 includes NMOS ESD/buffer transistors. The circuitry in first circuit area 70 may be connected to power supply bus 60 and bond pad 52 as described below. The circuitry in second circuit area 72 may be connected to power return bus 62 and bond pad 52 as described below. The bond pad structure 40 further includes a guard band region 80 as described below. As further shown in FIG. 2, control logic 84 is associated with each bond pad structure. In the embodiment of FIG. 2, control logic 84 is not located under bond pad 52.

In the embodiment of FIG. 2, the PMOS transistors are located in circuit area 70 adjacent to the outer edge of integrated circuit chip 56, and the NMOS transistors are located in circuit area 72 adjacent to control logic 84. In other embodiments, the locations of the PMOS transistors and the NMOS transistors may be reversed so that the PMOS transistors are located in circuit area 72 and the NMOS transistors are located in circuit area 70. If the locations of the PMOS and NMOS transistors are reversed, the locations of the power supply bus 60 and the power return bus 62 are reversed, and the locations of the guard bands in guard band region 80 are reversed. Furthermore, all interconnected bond pad structures are reversed in the same way.

Each of bond pads 50, 52, 54 provides a conductive surface for bonding of a connection element, such as a connection wire or a conductive bump material used for connection to another integrated circuit chip or a printed circuit board. In one embodiment, bond pad 52 has dimensions of 70 μm (micrometers) on a side. It will be understood that the bond pads may have larger or smaller dimensions depending on the application and the bonding process being used.

Figure 3:
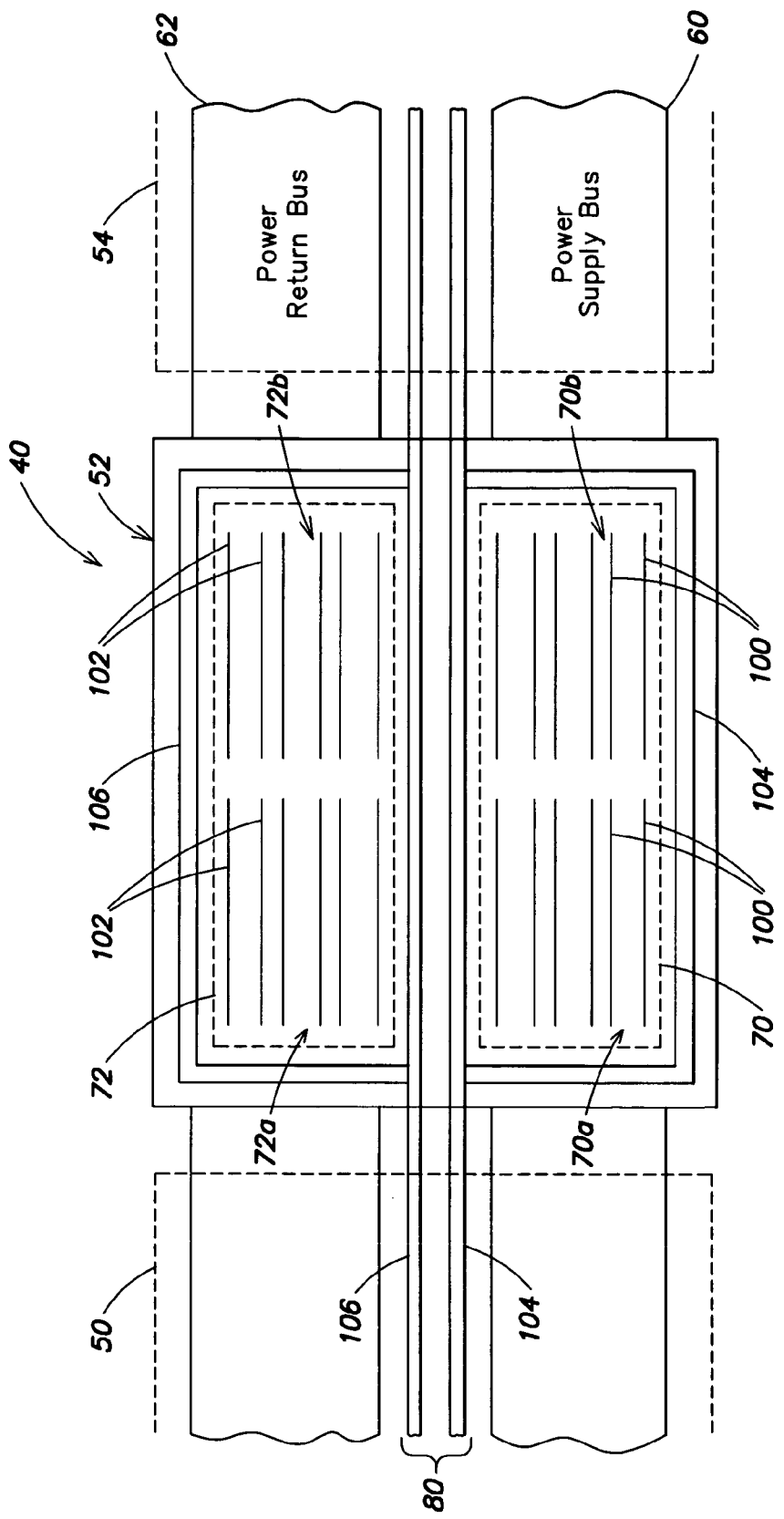
FIG. 3 is a top schematic view of the bond pad structure of FIG. 2 in greater detail.

The bond pad structure 40 is shown in greater detail in FIG. 3. In the embodiment of FIG. 3, first circuit area 70 includes a plurality of PMOS transistors 100, and second circuit area 72 includes a plurality of NMOS transistors 102. As indicated in FIG. 3, PMOS transistors 100 and NMOS transistors 102 are elongated in the direction of current flow in power supply bus 60 and power return bus 62, in order to provide relatively large ESD protection transistors while limiting the negative impact on the current-carrying capacity of power supply bus 60 and power return bus 62, as described below. That is, the bond pad structure shown and described herein provides both large ESD protection transistors and wide power supply and power return buses for effective ESD protection. In the embodiment of FIG. 3, bond pad structure 40 includes twelve PMOS transistors and twelve NMOS transistors. As further shown in FIG. 3, each of the circuit areas may be divided into subareas, each containing a group of transistors. Thus, first circuit area 70 is divided into circuit subareas 70a and 70b, each having six PMOS transistors 100. Similarly, second circuit area 72 is divided into circuit subareas 72a and 72b, each having six NMOS transistors 102. It will be understood that a greater or lesser number of transistors may be provided in each of the circuit areas.

The guard band region 80 provides isolation of PMOS transistors 100 and NMOS transistors 102. Guard band region 80 may include an N+ guard band 104 for isolation of PMOS transistors 100 and a P+ guard band 106 for isolation of NMOS transistors 102. The N+ guard band 104 may be fabricated in an N-well. Each of the guard bands 104 and 106 is connected by a metal interconnect layer to a reference voltage. The N+ guard band 104 is connected to power supply bus 60, and the P+ guard band 106 is connected to power return bus 62. The N+ guard band 104 may surround circuit area 70, and the guard band 106 may surround circuit area 72. This configuration isolates the PMOS and NMOS transistors from each other and also isolates the PMOS and NMOS transistors from circuitry under neighboring bond pads and from circuitry outside the bond pad. The guard bands 104 and 106 may be continuous through all of the bond pad structures.

Figure 4:
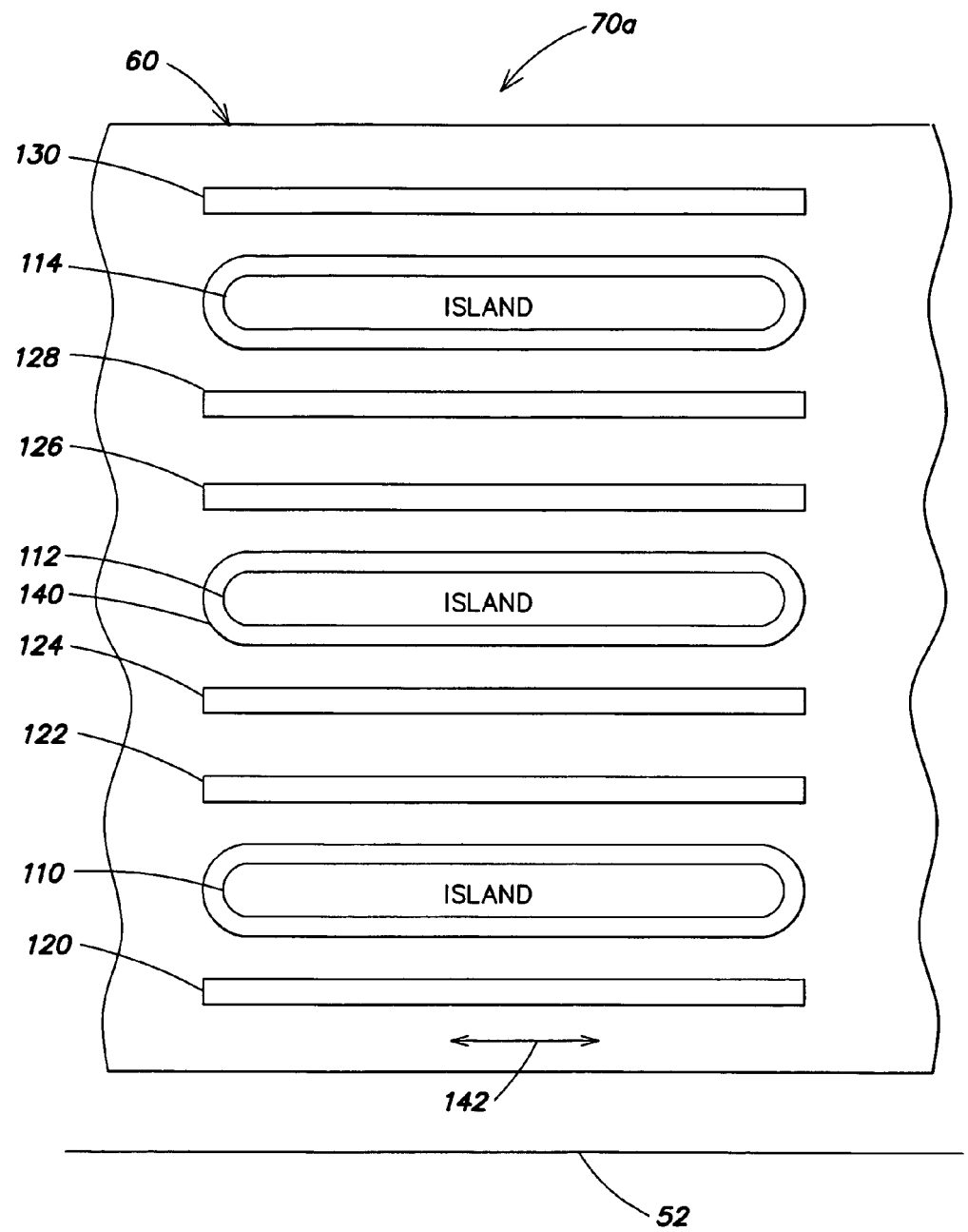
FIG. 4 is a top schematic view of a portion of the bond pad structure, showing the configuration of conductive islands in the power buses.
Figure 5:
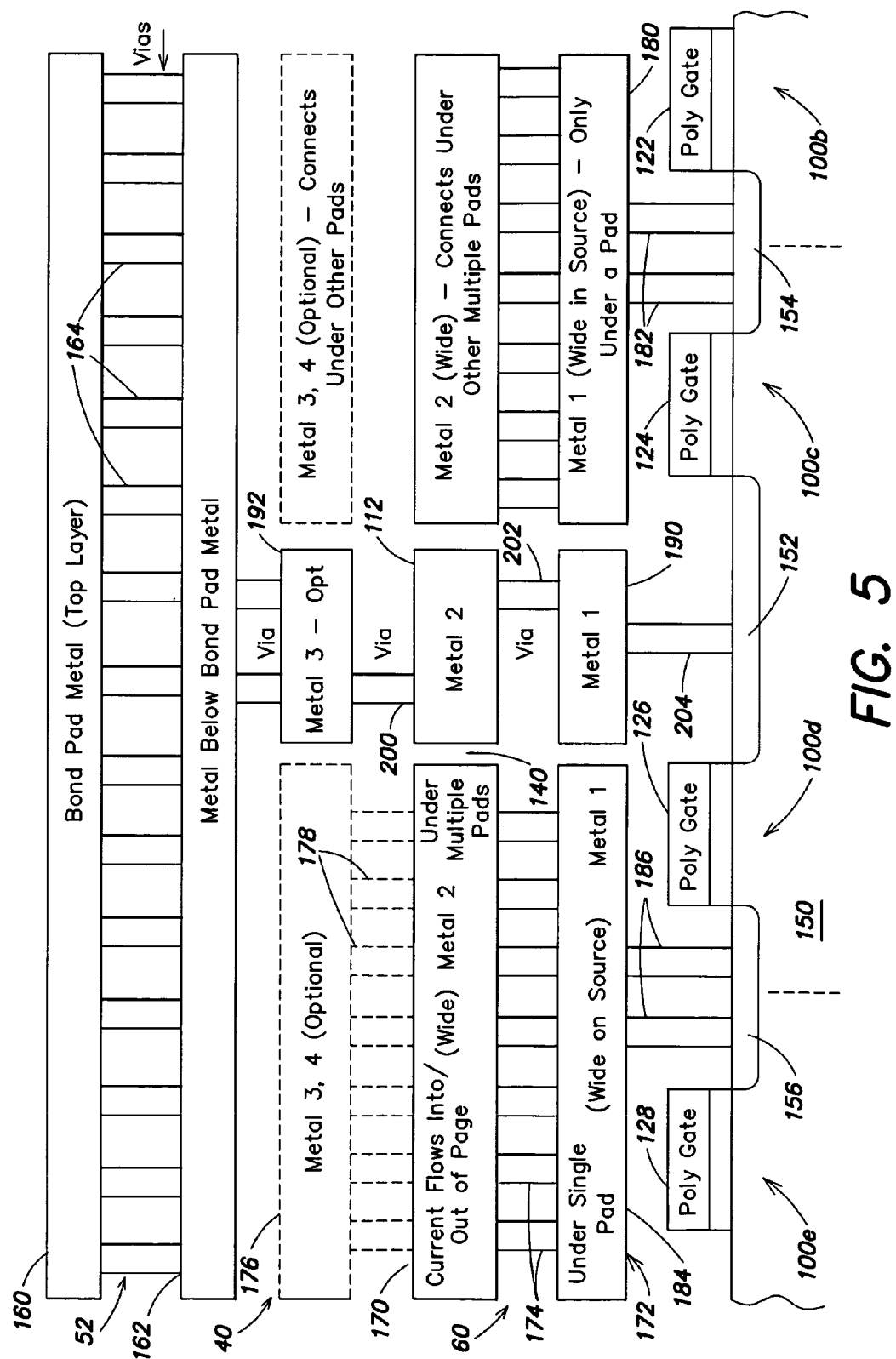
FIG. 5 is a partial cross-sectional view of the bond pad structure.

An enlarged top view of circuit subarea 70a of bond pad structure 40 is shown in FIG. 4. As shown, power supply bus 60 is provided with conductive islands 110, 112 and 114 for interconnecting bond pad 52 to the underlying transistors, as described below. Gates 120, 122, 124, 126, 128 and 130 of PMOS transistors 100 are shown in FIG. 4. As shown in FIG. 5 and described below, the gates are located below power supply bus 60 in the bond pad structure. Gates 120, 122, 124, 126, 128 and 130 are elongated in a direction 142 of current flow in power supply bus 60 and are narrow in a direction perpendicular to direction 142. In this embodiment, each conductive island connects to two underlying transistors. Accordingly, conductive island 110 is located between gates 120 and 122; conductive island 112 is located between gates 124 and 126; and conductive island 114 is located between gates 128 and 130.

Figure 7A:
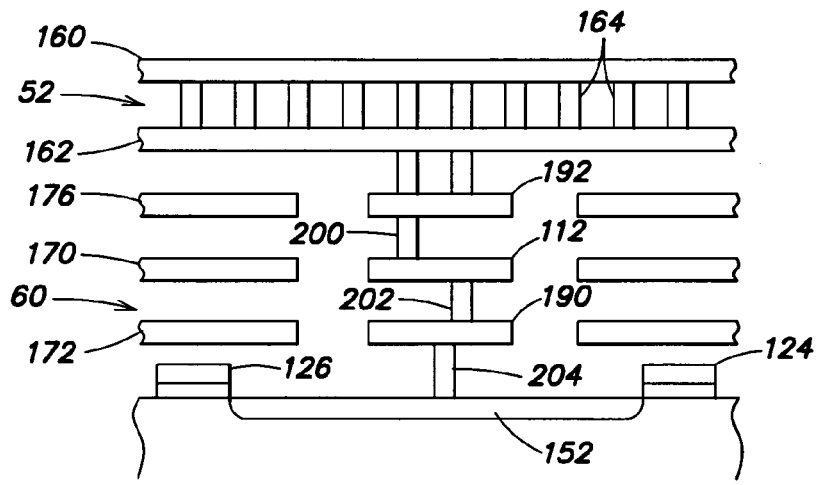
FIG. 7A is a partial cross-sectional view of the bond pad structure, taken along the line 7A—7A of FIG. 6.
Figure 7B:
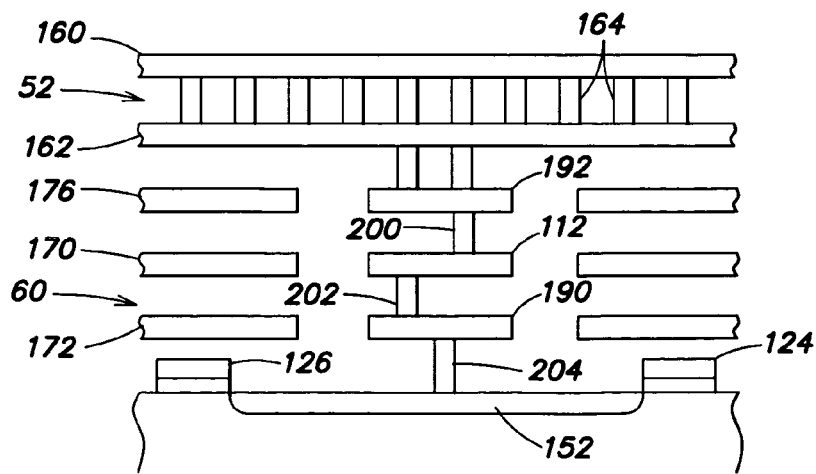
FIG. 7B is a partial cross-sectional view of the bond pad structure, taken along the line 7B—7B of FIG. 6.

Conductive islands 110, 112 and 114 are part of the same metal layer as power supply bus 60. In embodiments where power supply bus 60 includes two or more metal layers, vertically-aligned conductive islands are formed in each of the metal layers, as shown in FIGS. 7A and 7B and described below. Furthermore, conductive islands are formed in any additional metal layers between bond pad 52 and the underlying transistors.

Each conductive island 110, 112 and 114 has the form of an elongated metal strip that is electrically isolated from power supply bus 60 by a gap 140, which may be filled with an insulating material. It will be understood that power supply bus 60 and islands 110, 112 and 114 are supported by an underlying insulating layer. Conductive islands 110, 112 and 114 are configured to limit the negative impact on the current-carrying capacity of power supply bus 60, while allowing a relatively large current-carrying capacity between the bond pad 52 and the underlying transistors. In particular, each of the conductive islands is elongated in direction 142 of current flow in power supply bus 60 and is relatively narrow in a direction perpendicular to direction 142.

In one example, power supply bus 60 may have a width of 25 micrometers. Each of the conductive islands 110, 112 and 114 may have a length of approximately 20 micrometers and a width of about 1.1 to 1.5 micrometers, depending on the process technology. It will be understood that these values are given by way of example only and are not limiting as to the scope of the invention.

The direction of current flow through the conductive islands is not in the direction of elongation, but rather downward or upward through the layers of the bond pad structure, depending on the direction of ESD current flow. Since the current flow is not along the conductive island width or length direction, the conductive island widths can be very small.

A cross-sectional diagram of a portion of circuit subarea 70a of bond pad structure 40 is shown in FIG. 5. As indicated, bond pad structure 40 has a multilayer configuration. In FIG. 5, transistor structures, metal layers and interconnects are shown. It will be understood that metal layers are separated from transistors and from other metal layers by dielectric layers. The dielectric layers may utilize materials and layer thicknesses that are known to those skilled in the art of integrated circuit fabrication. The dielectric layers may have thicknesses in a range of about 0.3 to 1.0 micrometer, but are not limited to this range. The dielectric material may be selected to withstand the mechanical stress of the bonding process.

As shown in FIG. 5, PMOS transistors 100 may be fabricated in a silicon substrate 150 using a conventional CMOS process. Silicon substrate 150 may be an undoped silicon wafer or a doped well. If the source/drains of the transistors are P-type, substrate 150 is an N-well. If the source/drains of the transistors are N-type, substrate 150 is a P-well or an undoped wafer. An N-type transistor may also be fabricated in an isolated P-well region within a deep N-well tub. A drain region 152 serves transistors 100c and 100d. A source region 154 serves transistors 100b and 100c, and a source region 156 serves transistors 100d and 100e. For PMOS transistors 100, the source/drain regions are P-type. For NMOS transistors 102, the source/drain regions are N-type. Gates 122, 124, 126 and 128 are fabricated as a gate stack and include at least an insulating layer and a gate electrode, such as polysilicon, as known in the art. Additional details regarding fabrication of PMOS and NMOS transistors are known to those skilled in the art.

In the embodiment of FIGS. 2–8, the source and drain regions and the gates of the transistors are elongated in the direction of current flow in buses 60 and 62 and are narrow perpendicular to the direction of current flow. The elongated sources, drains and gates of the transistors may be referred to as "fingers" of the transistors. In some embodiments, the transistors in each circuit area may be connected independently. In other embodiments, two or more sets of fingers may be connected together to form a larger transistor having multiple fingers. In a multi-finger transistor, the source fingers are connected, the drain fingers are connected, and the gate fingers are connected.

Bond pad structure 40 further includes two or more patterned metal layers above circuit areas 70 and 72. The number of metal layers depends on the design of the integrated circuit. In the embodiment of FIG. 5, bond pad 52 includes a first pad layer 160, or top layer of the bond pad structure, and a second pad layer 162 below first pad layer 160. Pad layers 160 and 162 are metal and are interconnected by conductive vias 164. The term "vias" refers to vertical connections or contacts between different levels of the multilayer structure. The two-layer structure enhances the mechanical integrity and current-carrying capability of bond pad 52. It will be understood that bond pad 52 may be a single metal layer or two or more metal layers interconnected by vias. When a single metal layer is utilized, the single layer may be relatively thick and may be connected directly to the conductive islands. A single bond pad layer may have a thickness of 3 micrometers or greater, for example, and may be utilized in place of pad layers 160 and 162.

Figure 8:
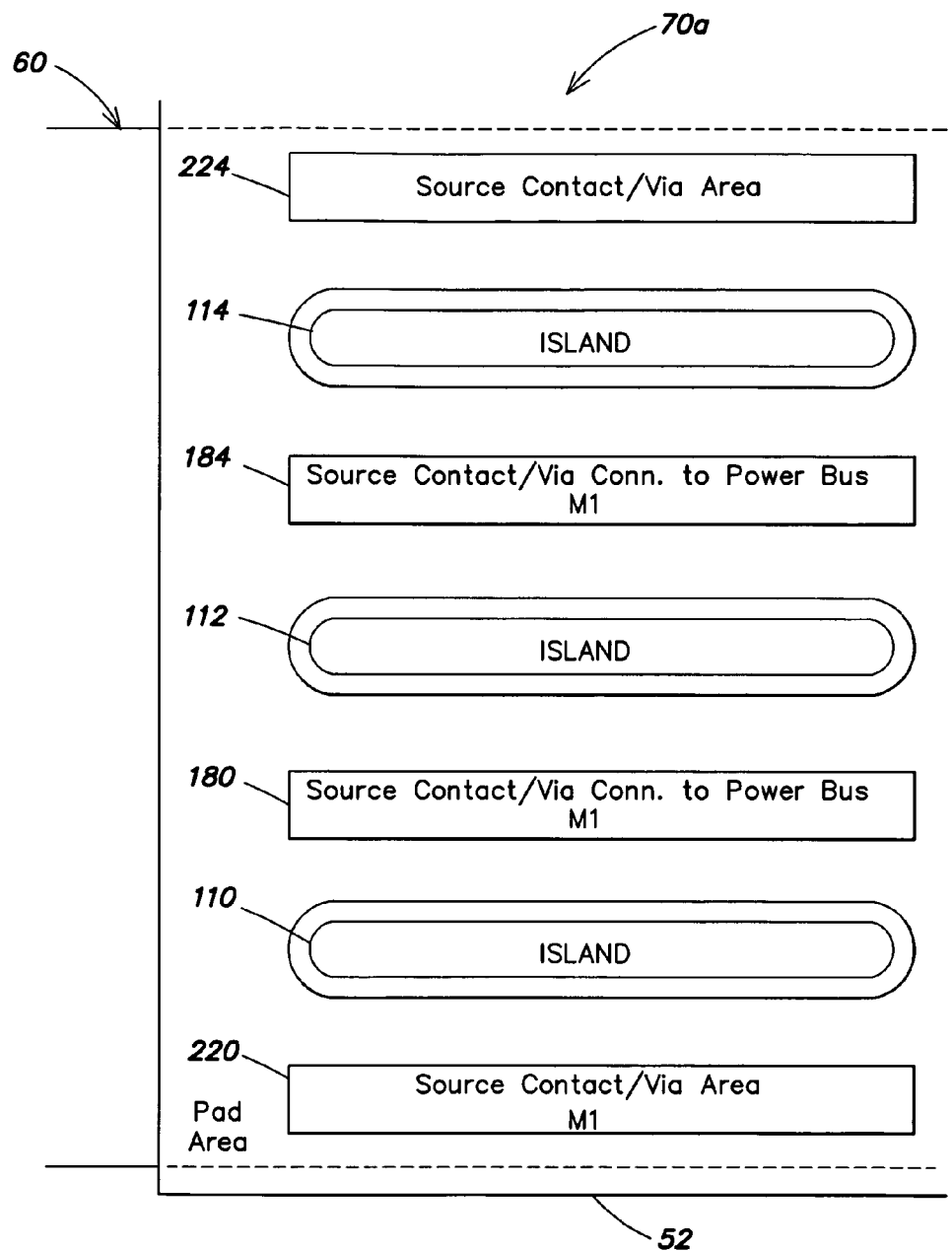
FIG. 8 is a partial top view of the bond pad structure, showing the source contacts and the conductive islands.

Power supply bus 60 may include a first bus layer 170 and a second bus layer 172 interconnected by conductive vias 174. In the embodiment of FIG. 5, first bus layer 170 is continuous through each of the bond pad structures, except for the conductive islands, such as conductive islands 110, 112 and 114, as shown in FIG. 4 and described above. Second bus layer 172 is patterned in each of the bond pad structures, as shown in FIG. 8 and described below. Power supply bus 60 may further include an optional third bus layer 176 interconnected to first bus layer 170 by conductive vias 178. Bus layers 170, 172 and 176 are metal. The number of metal layers depends, at least in part, on the desired current-carrying capacity of power supply bus 60.

Second bus layer 172 is patterned to form a first source contact 180 interconnected to source region 154 by conductive vias 182 and a second source contact 184 interconnected to source region 156 by conductive vias 186. The gates 120, 122, 124, 126, 128 and 130 of the PMOS transistors 100 may be interconnected to each other and to other circuitry, such as control logic 84 by an additional metal layer (not shown) between second bus layer 172 and transistors 100.

As further shown in FIG. 5, first bus layer 170 includes conductive island 112, second bus layer 172 includes a conductive island 190 and optional third bus layer 176, if present, includes a conductive island 192. Conductive islands 112, 190 and 192 are vertically aligned and are interconnected by conductive vias to provide an electrical connection between bond pad 52 and drain region 152 of each of the PMOS transistors.

Figure 6:
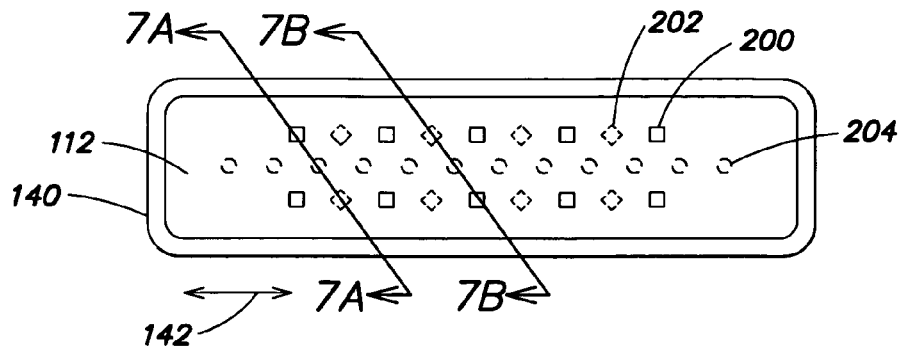
FIG. 6 is a top schematic view of a single conductive island.

Details of the interconnection between bond pad 52 and drain region 152 of the PMOS transistors are shown in FIGS. 6, 7A and 7B. Conductive island 112 is shown in FIG. 6 with conductive vias at different levels superimposed. In FIG. 6, square symbols represent conductive vias 200 between island 192 and island 112; diamond symbols represent conductive vias 202 between island 112 and island 190; and circle symbols represent conductive vias 204 between island 190 and drain region 152. FIG. 7A is a cross-section of conductive island 112 taken along the line 7A—7A of FIG. 6; and FIG. 7B is a cross-section of conductive island 112 taken along the line 7B—7B of FIG. 6. As shown in FIG. 6, conductive vias 200 (represented by square symbols) and conductive vias 202 (represented by diamond symbols) alternate along opposing edges of conductive island 112. Conductive vias 204 (represented by circle symbols) are arranged in a line along the center of conductive island 112 between vias 200 and 202. As best shown in FIGS. 7A and 7B, conductive vias 200 between islands 192 and 112 are laterally offset with respect to conductive vias 202 between islands 112 and 190. That is, vias between adjacent pairs of conductive islands are laterally offset. The lateral offset of conductive vias between adjacent pairs of conductive islands is apparent from the arrangement of vias shown in FIGS. 6, 7A and 7B. This arrangement avoids direct transfer of mechanical stress, applied during bonding, from bond pad 52 to underlying structures and thus reduces the risk of damage to underlying structures during the bonding process.

A top schematic view of circuit subarea 70a, which illustrates source contacts 180 and 184, is shown in FIG. 8. Subarea 70a also includes a source contact 220 adjacent to island 110 and a source contact 224 adjacent to island 114. As shown in FIGS. 5 and 8, source contacts 180, 184, 220 and 224 have relatively large areas and extend over the respective transistor gates to provide low resistance contacts to source regions 154, 156, etc. Source contacts 180, 184, 220 and 224 are formed in second bus layer 172 (FIG. 5). The large area source contacts at least partially restore to the power supply and power return buses the current-carry capability which is lost by fabricating the conductive islands and associated metal openings.

Circuit subarea 70a has been described above in connection FIGS. 4–8. It will be understood that circuit subarea 70b may have the same configuration. Furthermore, circuit subareas 72a and 72b may have a similar configuration, except that subareas 72a and 72b may include NMOS transistors rather than PMOS transistors. Furthermore, power return bus 62 passes through circuit subareas 72a and 72b. However, the geometry of the NMOS transistors and the configuration of the metal layers and interconnects may be as described above in connection with circuit subarea 70a, with appropriate changes of conductivity type.

Figure 1:
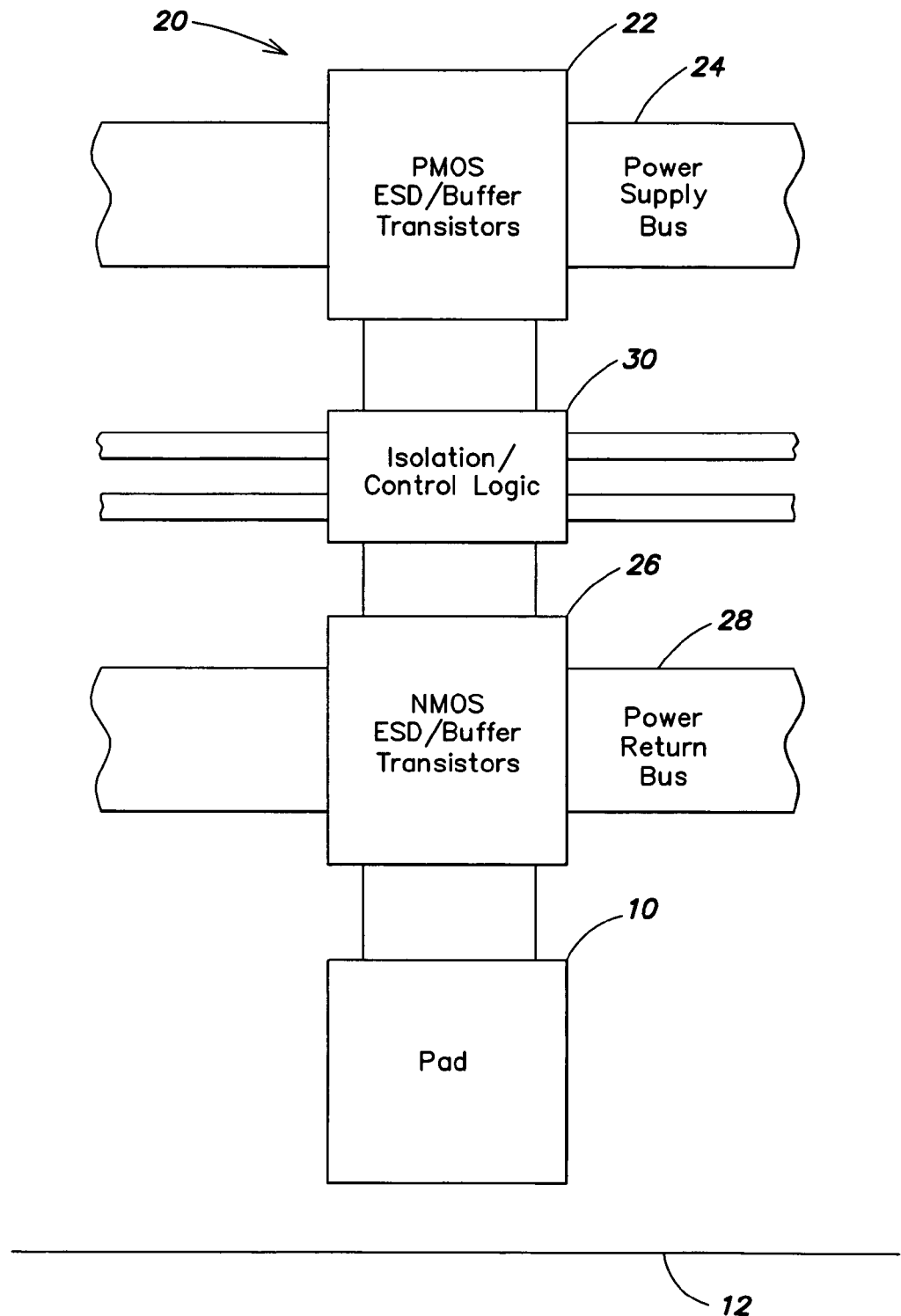
FIG. 1 is a top schematic view of a bond pad structure in accordance with the prior art.
Figure 9:
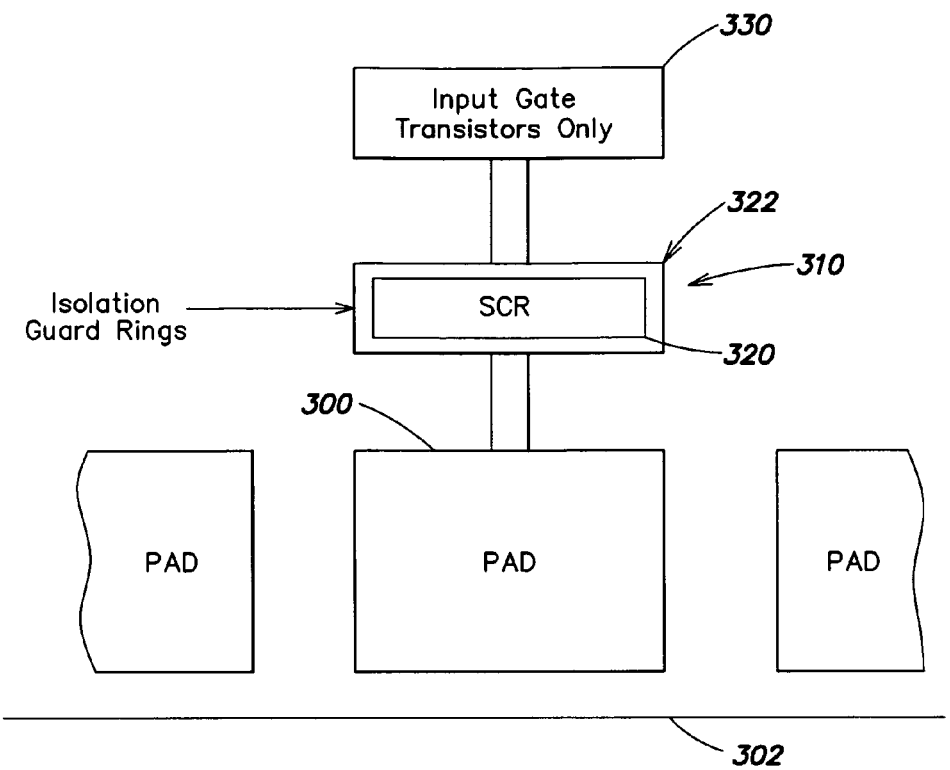
FIG. 9 is a top schematic view of a prior art bond pad structure utilizing SCRs.

A top schematic view of a second prior art bond pad structure is shown in FIG. 9. A bond pad 300 is located at the periphery of an integrated circuit chip 302. An ESD protection circuit 310 is located adjacent to and electrically connected to bond pad 300. ESD protection circuit 310 includes at least one SCR (silicon controlled rectifier) 320 surrounded by a guard band region 322. The SCR 320 is connected to input gate transistors 330. In prior art configurations, SCR 320 was used only for protection of inputs to integrated circuit chip 302. As in the prior art configuration of FIG. 1, bond pad 300 and ESD protection circuit 310 occupy significant chip area. The required area is multiplied by the number of I/O pins on the chip.

Figure 10:
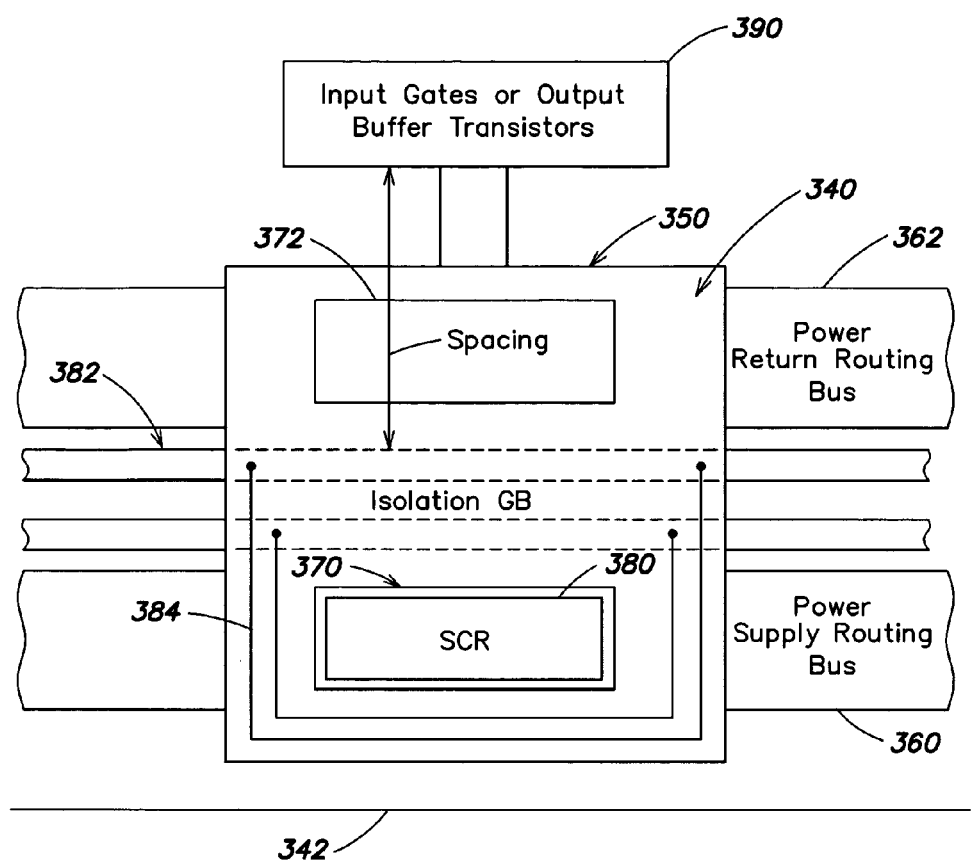
FIG. 10 is a top schematic view of a bond pad structure in accordance with a second embodiment of the invention.

A top schematic view of a bond pad structure 340 in accordance with a second embodiment of the invention is shown in FIG. 10. The bond pad structure 340 is one of an array of bond pad structures on an integrated circuit chip 342. The bond pad structure 340 includes a bond pad 350, a power supply bus 360 and a power return bus 362. Power supply bus 360 and power return 362 pass under bond pad 350 and may be parallel. The bond pad structure further includes a first circuit area 370 under power supply bus 360 and a second circuit area 372 under power return bus 362. In the embodiment of FIG. 10, first circuit area 370 includes at least one SCR 380, and second circuit area 372 does not contain circuitry. Instead, second circuit area 372 serves as an isolation area. The SCR 380 may be connected to power supply bus 360 and bond pad 350 using the interconnection techniques described above in connection with FIGS. 2–8.

The bond pad structure 340 further includes a guard band region 382 located between first circuit area 370 and second circuit area 372. The guard band region 382 is provided with a branch 384 so that SCR 380 is fully surrounded by guard band region 382.

SCR 380 is connected to and provides ESD protection for a circuit 390. Circuit 390 may include input circuitry or output buffer transistors, depending on whether bond pad 350 is functioning as an input or an output. The embodiment of FIG. 10 provides a high degree of isolation between SCR 380 and circuit 390. SCR 380 is spaced from circuit 390 by first circuit area 370. Furthermore guard band region 382 completely surrounds SCR 380 and provides isolation. As a result, the guard band structure 340 can be used for ESD protection of both input circuitry and output buffer transistors.

Figure 11:
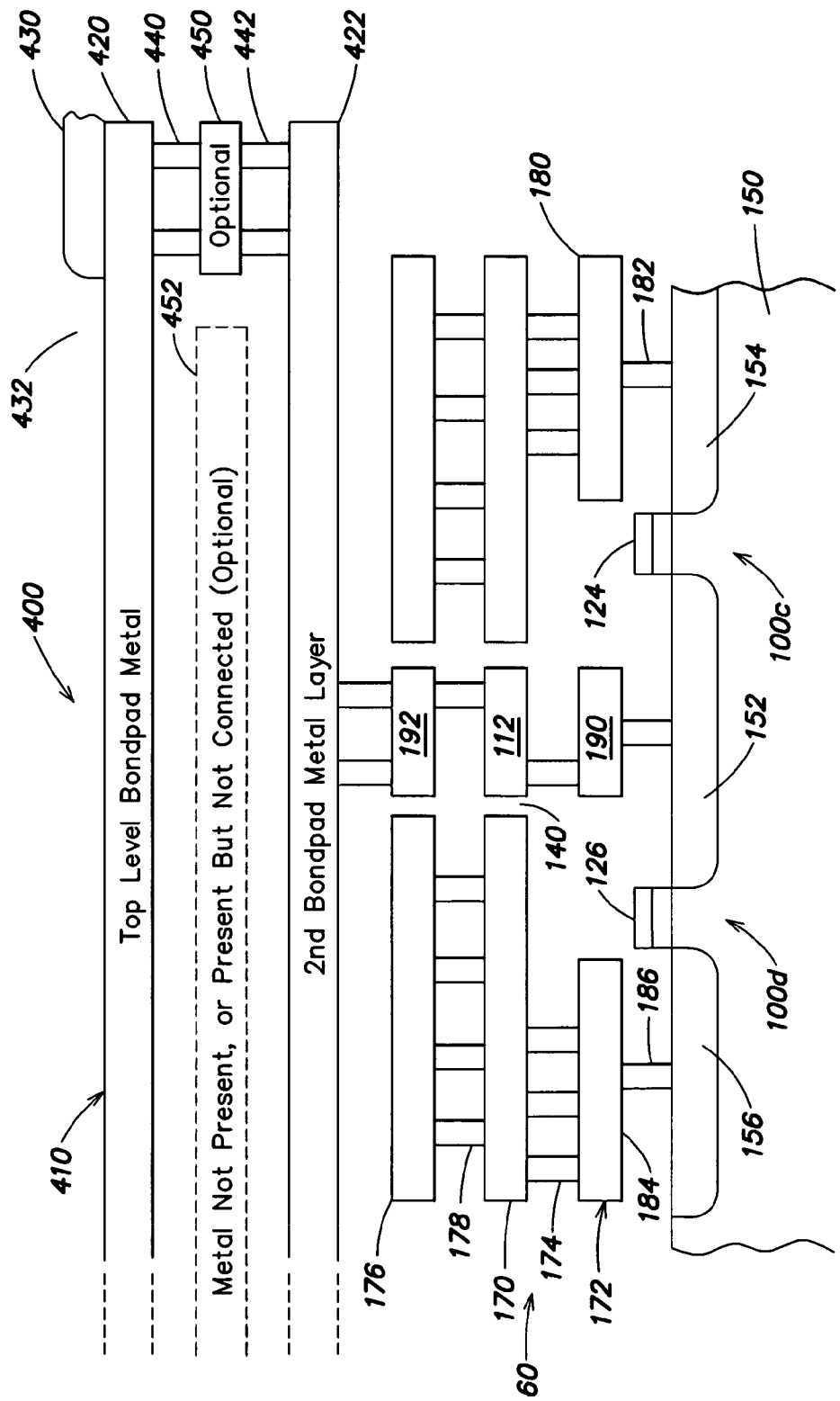
FIG. 11 is a partial cross-sectional view of a bond pad structure in accordance with a third embodiment of the invention.

A partial cross-sectional view of a bond pad structure in accordance with a third embodiment of the invention is shown in FIG. 11. Like elements FIG. 2-11 have the same reference numerals. In the embodiment of FIG. 11, a bond pad structure 400 includes a bond pad 410 having a first pad layer 420 spaced from a second pad layer 422. A passivation layer 430 defines a passivation opening 432 for bonding of a wire or other connection element. First pad layer 420 is connected to second pad layer 422 through vias 440 and 442, and an optional conductive island 450. Conductive island 450 may be utilized in an embodiment where a metal layer 452 is present between first pad layer 420 and second pad layer 422. It will be understood that, except for conductive island 450, metal layer 452 is not electrically connected to first pad layer 420 or second pad layer 422. The connection between pad layers 420 and 422, including vias 440 and 442 and conductive island 450, may be located outside passivation opening 432 and under passivation layer 430. The configuration of FIG. 11 may provide reduced capacitance for enhanced operation at high frequencies, including RF frequencies.

According to another feature, it may be noted that source contacts 180 and 184 are narrower in the embodiment of FIG. 11 than in the embodiment of FIG. 5 and do not extend over gates 124 and 126. Nonetheless, source contacts 180 and 184 are relatively wide to enhance the current-carrying capability between sources 154 and 156 and power supply bus 60. In other respects, the bond pad structure may be fabricated as described above in connection with FIGS. 2–8.

Having thus described the inventive concepts and a number of exemplary embodiments, it will be apparent to those skilled in the art that the invention may be implemented in various ways, and that modifications and improvements will readily occur to such persons. Thus, the examples given are not intended to be limiting, and are provided by way of example only. The invention is limited only as required by the following claims and equivalents thereto.

What is claimed is:

1. A bond pad structure for an integrated circuit, comprising:
   first and second active devices formed in a substrate;
   first and second buses above the first and second active devices, respectively;
   a bond pad above the first and second buses;
   first interconnections between the first and second active devices and the bond pad, wherein the first interconnections include at least one conductive level between the bond pad and the respective active devices, first contacts between the conductive level and a layer above the conductive level, and second contacts between the conductive level and a layer below the conductive level, wherein the first contacts are laterally offset relative to the second contacts; and
   second interconnections between the first and second active devices and the first and second buses, respectively.

2. A bond pad structure as defined in claim 1, wherein said first active device comprises at least one PMOS transistor and said second active device comprises at least one NMOS transistor.

3. A bond pad structure as defined in claim 2, wherein the PMOS and NMOS transistors each include two or more connected source fingers, two or more connected drain fingers and two or more connected gate fingers.

4. A bond pad structure as defined in claim 2, wherein said first bus comprises a power supply bus and wherein said second bus comprises a power return bus.

5. A bond pad structure as defined in claim 4, wherein said first and second buses connect to a plurality of bond pad structures on an integrated circuit chip.

6. A bond pad structure as defined in claim 2, wherein the PMOS and NMOS transistors each include source, drain and gate fingers which are elongated in a direction of current flow in the first and second buses and which are narrow perpendicular to the direction of current flow.

7. A bond pad structure as defined in claim 2, wherein the conductive level comprises conductive islands in the first and second buses for connection of the bond pad to the PMOS and NMOS transistors.

8. A bond pad structure as defined in claim 7, wherein the conductive islands are elongated in a direction of current flow in the first and second buses and are narrow perpendicular to the direction of current flow.

9. A bond pad structure as defined in claim 7, wherein each of the first interconnections comprises a plurality of individual contacts between the bond pad and the conductive islands and between the conductive islands and the active devices.

10. A bond pad structure as defined in claim 2, wherein the PMOS and NMOS transistors are configured as electrostatic discharge protection devices.

11. A bond pad structure as defined in claim 1, wherein said first active device comprises two or more PMOS transistors and said second active device comprises two or more NMOS transistors.

12. A bond pad structure as defined in claim 3, further comprising a guard band region formed in the substrate.

13. A bond pad structure as defined in claim 12, wherein said guard band region comprises an N+ guard band in an N-well for isolation of the PMOS transistor, a P+ guard band for isolation of the NMOS transistor and conductive interconnects between the power supply bus and the N+ guard band and between the power return bus and the P+ guard band.

14. A bond pad structure as defined in claim 13, wherein in the N+ guard band surrounds the PMOS transistor and the P+ guard band surrounds the NMOS transistor.

15. A bond pad structure as defined in claim 2, wherein the PMOS and NMOS transistors are interconnected in a CMOS configuration.

16. A bond pad structure as defined in claim 2, further comprising a metal level for connections to the gates of the PMOS and NMOS transistors.

17. A bond pad structure as defined in claim 2, wherein the first interconnections comprise connections between the bond pad and the drains of the PMOS and NMOS transistors.

18. A bond pad structure as defined in claim 4, wherein the second interconnections comprise a connection between the power supply bus and the source of the PMOS transistor.

19. A bond pad structure as defined in claim 18, wherein the second interconnections comprise a relatively wide source contact layer and distributed connections to the power supply bus.

20. A bond pad structure as defined in claim 4, wherein the second interconnections comprise a connection between the power return bus and the source of the NMOS transistor.

21. A bond pad structure as defined in claim 20, wherein the second interconnections comprise a relatively wide source contact layer and distributed connections to the power return bus.

22. A bond pad structure as defined in claim 9, wherein the contacts between adjacent levels of the structure are distributed over the conductive islands.

23. A bond pad structure as defined in claim 1, wherein the bond pad includes two or more spaced-apart bond pad layers.

24. A bond pad structure as defined in claim 23, wherein the two or more bond pad layers are interconnected by a plurality of individual contacts within a passivation opening associated with the bond pad structure.

25. A bond pad structure as defined in claim 23, wherein the two or more bond pad layers are interconnected by contacts located outside a passivation opening associated with the bond pad structure.

26. A bond pad structure as defined in claim 1, wherein the bond pad comprises a single, relatively thick metal layer.

27. A bond pad structure for an integrated circuit, comprising:
   an active device formed in a substrate;
   a power bus above the active device;
   a bond pad above the power bus;
   a first interconnection between the active device and the bond pad wherein the first interconnection includes at least one conductive level between the bond pad and the active device, a first contact between the conductive level and a layer above the conductive level, and a second contact between the conductive level and a layer below the conductive level, wherein the first contact is laterally offset relative to the second contact; and
   a second interconnection between the active device and the power bus.

28. A bond pad structure as defined in claim 27, wherein the active device comprises at least one MOS transistor.

29. A bond pad structure as defined in claim 28, wherein the at least one MOS transistor includes source, drain and gate fingers which are elongated in a direction of current flow in the power bus and which are narrow perpendicular to direction of current flow.

30. A bond pad structure as defined in claim 27, wherein the active device comprises at least one silicon controlled rectifier.

31. A bond pad structure as defined in claim 27, wherein the active device comprises at least one electrostatic discharge protection device.

32. A bond pad structure for an integrated circuit, comprising:
   first and second circuit areas on a substrate;
   a guard band region formed in the substrate;
   first and second buses above the first and second circuit areas, respectively;
   a bond pad above the first and second buses;
   at least one first interconnection between circuitry in one or both of the first and second circuit areas and the bond pad wherein the first interconnection includes at least one conductive level between the bond pad and the circuitry, a first contact between the conductive level and a layer above the conductive level, and a second contact between the conductive level and a layer below the conductive level, wherein the first contact is laterally offset relative to the second contact; and
   at least one second interconnection between circuitry in one or both of the first and second circuit areas and the first and second buses.

33. A bond pad structure as defined in claim 32, further comprising at least one PMOS transistor in the first circuit area and at least one NMOS transistor in the second circuit area.

34. A bond pad structure as defined in claim 33, wherein the PMOS and NMOS transistors comprise an electrostatic discharge protection circuit.

35. A bond pad structure as defined in claim 32, further comprising at least one silicon controlled rectifier in the first circuit area, wherein the second circuit area comprises an isolation area.

36. A bond pad structure as defined in claim 35, further comprising a guard band region surrounding the silicon controlled rectifier.

37. A bond pad structure as defined in claim 35, wherein the silicon controlled rectifier is configured for protecting an output of a circuit.

* * * * *